(12) United States Patent
Davis et al.

(10) Patent No.: US 7,627,947 B2
(45) Date of Patent: Dec. 8, 2009

(54) METHOD FOR MAKING A MULTILAYERED CIRCUITIZED SUBSTRATE

(75) Inventors: Thomas J. Davis, Binghamton, NY (US); Subahu D. Desai, Vestal, NY (US); John M. Lauffer, Waverly, NY (US); James J. McNamara, Jr., Vestal, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 302 days.

(21) Appl. No.: 11/797,232

(22) Filed: May 2, 2007

(65) Prior Publication Data

US 2007/0199195 A1    Aug. 30, 2007

Related U.S. Application Data

(63) Continuation-in-part of application No. 11/110,919, filed on Apr. 21, 2005, now Pat. No. 7,293,355.

(51) Int. Cl.
*H05K 3/10* (2006.01)
*H01R 12/04* (2006.01)

(52) U.S. Cl. .............................. 29/852; 29/830; 29/846; 174/261

(58) Field of Classification Search ................ 29/846, 29/852, 830, 853; 174/261
See application file for complete search history.

(56) References Cited

U.S. PATENT DOCUMENTS

| | | | |
|---|---|---|---|
| 4,372,800 A | 2/1983 | Oizumi et al. | |
| 4,557,784 A | 12/1985 | Uekita et al. | |
| 4,659,425 A | 4/1987 | Eggers et al. | |
| 5,153,986 A | 10/1992 | Brauer et al. | |
| 5,744,758 A * | 4/1998 | Takenouchi et al. | 174/255 |
| 5,822,856 A * | 10/1998 | Bhatt et al. | 29/832 |
| 6,015,520 A | 1/2000 | Appelt et al. | |
| 6,073,344 A | 6/2000 | Japp et al. | |
| 6,175,087 B1 | 1/2001 | Keesler et al. | |
| 6,188,027 B1 | 2/2001 | Miller et al. | |
| 6,204,453 B1 | 3/2001 | Fallon et al. | |
| 6,320,140 B1 * | 11/2001 | Enomoto | 174/264 |
| 6,323,439 B1 * | 11/2001 | Kambe et al. | 174/262 |
| 6,349,871 B1 | 2/2002 | Card, Jr. et al. | |
| 6,351,393 B1 * | 2/2002 | Kresge et al. | 361/795 |
| 6,388,204 B1 | 5/2002 | Lauffer et al. | |
| 6,479,093 B2 | 11/2002 | Lauffer et al. | |
| 6,493,861 B1 | 12/2002 | Li et al. | |
| 6,495,239 B1 | 12/2002 | Bhatt et al. | |
| 6,500,349 B2 | 12/2002 | Andresakis et al. | |
| 6,521,844 B1 | 2/2003 | Fuerniss et al. | |

(Continued)

*Primary Examiner*—C. J Arbes
(74) *Attorney, Agent, or Firm*—Hinman, Howard & Kattell; Lawrence R. Fraley; Mark Levy

(57) ABSTRACT

A method of making a multilayered circuitized substrate in which a continuous process is used to form electrically conductive layers which each will form part of a sub-composite. The sub-composites are then aligned such that openings within the conductive layers are also aligned, the sub-composites are then bonded together, and a plurality of holes are then laser drilled through the entire thickness of the bonded structure. The dielectric layers used in the sub-composites do not include continuous or semi-continuous fibers therein, thus expediting hole formation there-through.

13 Claims, 8 Drawing Sheets

U.S. PATENT DOCUMENTS

| | | |
|---|---|---|
| 6,570,102 B2 * | 5/2003 | Miller et al. ................ 174/261 |
| 6,626,196 B2 | 9/2003 | Downes, Jr. et al. |
| 6,628,531 B2 | 9/2003 | Dadafshar |
| 6,630,630 B1 | 10/2003 | Maezawa et al. |
| 6,630,743 B2 | 10/2003 | Magnuson et al. |
| 6,631,558 B2 | 10/2003 | Burgess |
| 6,631,838 B2 | 10/2003 | Kim et al. |
| 6,638,690 B1 | 10/2003 | Meier et al. |
| 6,638,858 B2 | 10/2003 | Cheng |
| 6,750,405 B1 | 6/2004 | Fallon et al. |

* cited by examiner

METHOD FOR MAKING A MULTILAYERED CIRCUITIZED SUBSTRATE

CROSS REFERENCE TO CO-PENDING APPLICATIONS

In Ser. No. 11/110,919, filed Apr. 21, 2005, there is defined an apparatus and method for making circuitized substrates using a continuous roll format in which layers of conductor and dielectric are fed into the apparatus, bonded, and passed on to other nearby work stations in which various processes such as hole formation, circuitization and, finally, segmentation occur. The resulting substrates can then be individually bonded to other, like substrates to form a larger multi-layered substrate with a plurality of conductive thru-holes, conductive and dielectric layers as part thereof.

In Ser. No. 11/110,920, also filed Apr. 21, 2005, there is also defined an apparatus and method for making circuitized substrates using a continuous roll format. As in Ser. No. 11/110,919, a layer of conductor is fed into the apparatus. In Ser. No. 11/110,920, however, layers of photo-imageable dielectric are applied to opposite sides of the conductor layer, following which thru-holes are formed through the composite, and then metal layers are added over the dielectric. Patterns (e.g., circuit) are formed in the metal layers. Several operations are performed in addition to these to form the final end product, a circuitized substrate (e.g., printed circuit board), all while the conductor layer of the product is retained in a solid format, up to the final separation from the continuous layer.

Both of the above applications are assigned to the same Assignee as the present invention. The present application is a continuation-in-part of Ser. No. 11/110,919 filed Apr. 21, 2005 now U.S. Pat. No. 7,293,355.

TECHNICAL FIELD

The present invention relates to the manufacture of multi-layered circuitized substrates such as printed circuit boards, chip carriers, and the like. The invention particularly relates to the manufacture of such substrates in which conductive thru-holes are provided therein.

BACKGROUND OF THE INVENTION

During the known manufacture of circuitized substrates such as printed circuit boards and chip carriers, especially those of the multilayered type, many individual processes such as etching, plating, lamination, drilling, testing, inspection, etc. are required. These processes are usually performed at different locations within the manufacturing facility, requiring shipment of partially completed substrates from one station to another at such different locations. As defined in the two co-pending applications cited above, it is possible to combine many of these processes while producing a substrate in a continuous roll format; that is, a series of rolls are used to continuously move a common part of the eventual substrate along while such processes are then performed thereon. Such continuous processing, defined therein as in a roll-to-roll format, serves to reduce costs and time consumed in the total substrate manufacturing process. Such savings are especially significant if possible when producing relatively complex, multilayered substrates having several conductive and dielectric layers so that the savings may be passed down to the eventual consumer of the products using such substrates. Such products may include computers, computer servers, mainframes, etc. and many others not related directly to computers.

As is known, these boards typically consist of parallel, planar, alternating inner layers of insulating (dielectric) substrate material and conductive metal. The exposed outer sides of the laminated structure are often provided with circuit patterns, as with double-sided boards, and the metal inner layer or layers typically contain circuit patterns, or, in the case of internal power planes, layers that are substantially solid. These latter layers also often include clearance openings or other openings if desired.

In multilayer printed circuit boards and chip carriers, it is often necessary to provide conductive interconnections between the various conductive layers or sides of the substrate. This is commonly achieved by providing metallized, conductive thru holes in the board which communicate with the sides and layers requiring electrical interconnection. For some applications, it is desired that electrical connection be made between all or almost all of the conductive layers. It is often desired to also provide electrical connection between the circuitry on one face of the board and one or more of the inner circuit layers. In those cases, "blind vias", passing only part way through the board, are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. The term "conductive thru-hole" as used in the art may thus include thru holes that pass entirely through the board (also referred to in the printed circuit field as plated thru holes or PTHs), "blind vias" which extend from an external surface of the board into a specified conductive layer of the board, as well as an "internal via" which is internally "captured" by the board's outer layers.

To provide the desired circuit pattern on the substrate, a variety of even more manufacturing processes are required, examples being those which fall into the broad categories of "subtractive" or "additive" techniques. Common to subtractive processing is the need to etch away (or subtract) metal to expose substrate surface in areas where no circuitry is desired. Additive processes, on the other hand, begin with exposed substrate surfaces (or thin commoning metallization layers for additive electroplate) and build up thereon of metallization in desired areas, the desired areas being those not masked by a previously-applied pattern of plating resist material (e.g., called photo-resist in the printed circuit board field).

Typically, the dielectric materials used for such multilayered products include some form of supporting material in the form of either fibers or mesh within the dielectric (usually a resin which is cured). Perhaps the most common form of such dielectric material known and used in the industry today is referred to simply as "FR4", which is comprised of epoxy resin with fiber glass embedded therein. Such fiber glass is typically in the form of continuous or semi-continuous fibers which extend within the cured, hardened resin. Other dielectric materials include polytetrafluoroethylene (e.g., Teflon, a trademark of E.I. du Pont de Nemours & Company) and Driclad material (Driclad is a trademark of the Assignee of this invention, Endicott Interconnect Technologies, Inc.), etc. With such other materials, however, it is also often considered necessary to provide fiber or mesh for reinforcement purposes.

The presence of glass fibers, especially woven glass fibers, also substantially impairs the ability to form high quality, very small thru-holes, including when using a laser. This problem is increased significantly when patterns of such thru holes are required to satisfy the high density requirements of many of today's circuitized substrates, especially those in the computer field. Examples of high density patterns may include thru hole patterns as dense as 5,000 thru holes per square inch and perhaps greater, including in some known examples as high as 10,000 thru holes per square inch, of the substrate's area. If used in such an environment, glass cloth will possess drastically different absorption and heat of ablation properties than typical thermo-set or thermo-plastic matrix resins. In a typical woven glass cloth, for example, the density of glass a laser might encounter can vary from approximately 0% in a window area to approximately 50% by volume or even more, especially in an area over a cloth "knuckle". This wide variation in encountered glass density leads to problems obtaining the proper laser power for each thru-hole and may result in wide variations in thru-hole quality, obviously unacceptable by today's very demanding manufacturing standards.

The presence of glass fibers in a multilayered structure of the types mentioned herein also often contributes to an electrical failure mode known as CAF growth. CAF (cathodic/anodic filament) growth often results in an electrical shorting failure which occurs when dendritic metal filaments grow along an interface (typically a glass fiber/epoxy resin interface), creating an electrical path between two features which should remain electrically isolated. Whether continuous (like woven cloth) or semi-continuous (like chopped fiber mattes), glass fiber lengths are substantial in comparison to the common distances between isolated internal features, and thus glass fibers can be a significant detractor for PCB insulation resistance reliability. While the use of glass mattes composed of random discontinuous chopped fibers (in comparison to the longer fibers found in continuous structures) can largely abate the problem of inadequate laser drilled thru-hole quality, such mattes still contain fibers with substantial length compared to internal board feature spacing and, in some cases, offer virtually no relief from the problem of this highly undesirable type of growth.

Examples of methods of making circuitized substrates, including multilayered boards, and even further including providing same with such thru holes, are shown and described in the following U.S. Letters Patents, as are examples of various types of boards produced by such methods:

6,015,520 Method For Filling Holes in Printed Wiring Boards
6,073,344 Laser Segmentation of Plated Through-Hole Sidewalls To Form Multiple Conductors
6,175,087 Composite Laminate Circuit Structure And Method Of Forming The Same
6,188,027 Protection of a Plated Through Hole From Chemical Attack
6,204,453 Two Signal One Power Plane Circuit Board
6,349,871 Process For Reworking Circuit Boards
6,388,204 Composite Laminate Circuit Structure And Methods Of Interconnecting The Same
6,479,093 Composite Laminate Circuit Structure And Methods Of Interconnecting The Same
6,493,861 Interconnected Series of Plated Through Hole Vias and Method of Fabrication Therefore
6,495,239 Dielectric Structure And Method Of Formation
6,521,844 Through Hole In A Photoimageable Dielectric Structure With Wired And Uncured Dielectric
6,626,196 Arrangement and Method For Degassing Small-High Aspect Ratio Drilled Holes Prior To Wet Chemical Processing
6,628,531 Multi-Layer and User-Configurable Micro-Printed Circuit Board
6,630,630 Multilayer Printed Wiring Board and Its Manufacturing Method
6,630,743 Copper Plated PTH Barrels and Methods For Fabricating
6,631,558 Blind Via Laser Drilling System
6,631,838 Method For Fabricating Printed Circuit Board -continued 6,638,690 Method For Producing Multi-Layer Circuits
6,638,858 Hole Metal-Filling Method
6,750,405 Two Signal One Power Plane Circuit Board As mentioned in the above co-pending applications, attempts have been made to manufacture at least some parts of circuit boards using what might be referred to as a continuous process. Examples of some of these processes are described below. The listing of the patents both above and below is not an admission that any are prior art to the present invention.

In U.S. Pat. No. 4,372,800, issued Feb. 8, 1983, there is described a "continuous" process for producing reinforced resin laminates comprising the steps of impregnating a fibrous substrate with a liquid resin (allegedly free of volatile solvent and capable of curing without generating liquid and gaseous by-products), laminating a plurality of the resin-impregnated substrates into a unitary member, sandwiching the laminate between a pair of covering sheets, and curing the laminate between said pair of covering sheets, without applying appreciable pressure. The patent discusses adjusting the final resin content in the resin impregnated substrate at 10 to 90% by weight, based on the total weight of the impregnated substrate.

In U.S. Pat. No. 4,557,784, issued Dec. 10, 1985; there is described a metal clad laminate produced in "continuous" manner by impregnating a plurality of fibrous substrate with a curable liquid resin, combining the plurality of substrates together and simultaneously laminating a metal foil onto at least one side of said substrates, and curing the laminate. This patent discusses the steps of applying an adhesive onto the metal foil to form a film and heating the film in situ continuously prior to step of the laminating of said metal foil.

In U.S. Pat. No. 4,579,612, issued Apr. 1, 1986, there is described the formation of an "electro-laminate" made of a core of insulating material webs with a high purity electrolytic copper foil on at least one side of the core, for use as a circuit board in electronic equipment. The web of insulating material and the copper foil are led from supply rolls to a laminating machine in out-of-contact relation. Prior to its introduction into the laminating machine, the copper foil is heated to the temperature of the laminating operation so that it is at its maximum thermally expanded length when it contacts the insulating material webs. Further, dust is removed from the copper foil as it enters the laminating machine. The webs and copper foil are moved at the same speed through the laminating machine. After pressing the electro-laminate in the laminating machine, it is moved through a cooling device. Subsequently, the electro-laminate can be wound in a roll or cut into individual lengths.

In U.S. Pat. No. 4,659,425, issued Apr. 21, 1987, there is described a "continuous" method wherein a coating of a solvent-free thermosetting resin is applied to the surface of a metal foil. This resin-coated foil is advanced into contact with a reinforcing cloth sheet layer to form a foil/cloth assembly. The assembly is continuously conveyed between a pair of endless belts revolving in opposite directions with mutually facing surfaces, the belts being heated to the curing temperature of the resin whereby the belts are pressed against the assembly to continuously compact the assembly and cure the resin to form a composite product which can then be circuitized. This partial process does not include many of the essential steps such as defined above which are necessary for boards of more complex construction, especially those needing conductive thru-holes as part thereof.

In U.S. Pat. No. 5,153,986, issued Oct. 13, 1992, there is described a method of fabricating a multilayer electronic circuit package. The multilayer circuit package has at least one layer that is a circuitized, polymer encapsulated metal core. According to the method of the invention a metal foil is provided for the metal core of the layer. This metal core foil may be provided as a single unit or in a roll to roll, process. The thru holes are drilled, etched, or punched through the metal foil. An adhesion promoter is then applied to the perforate metal foil for subsequent adhesion of polymer to the foil. The dielectric polymer is then applied to the perforate metal foil core by vapor depositing, chemical vapor depositing, spraying or electrophoretically depositing, a thermally processable dielectric polymer or precursor thereof onto exposed surfaces of the perforate metal foil including the walls of the thru holes. The dielectric polymer or precursor thereof is then thermally processed to form a conformal dielectric, polymeric coating on surfaces of the perforate metal foil, including the interior surfaces of the thru holes. This dielectric, polymeric coating may then be circuitized, and coated with an adhesive for lamination to the next adjacent layer. After lamination, one or more chips are attached to the completed package.

In U.S. Pat. No. 6,500,349, issued Dec. 31, 2002, there is described a "continuous" process for forming multilayer circuit structures which includes applying and curing a film forming polymer onto the matte side of a copper foil. The opposite (shiny) side of the foil is cleaned, and applied with a photo-resist which is then dried. The photo-resist is exposed, and developed to remove the non-image areas, while leaving the image areas. The foil under the removed non-image area is then etched to form a copper pattern, and the remaining photo-resist is removed. The foil is then cut into sections, and then punched with registration holes. The copper pattern is then treated with a bond enhancing treatment, inspected for defects, and laminated onto a substrate to form a multilayered circuit structure.

The present invention represents a new and unique method of forming circuitized substrates having conductive thru holes therein, in comparison to those above and other processes known in the art. Significantly, the method as defined herein involves the making of a circuitized substrate in which a continuous process is used to form one of the key elements of a sub-composite which will eventually form part of the final composite multilayered substrate along with at least one other (and preferably more) sub-composites, these sub-composites being bonded together to form the final structure. Significantly, thru holes may then be formed which extend entirely through the thickness of the formed composite while using laser ablation to form same, thereby omitting the need for mechanical drilling. The dielectric material for the sub-composites assures effective laser drilling without harm to the dielectric because it does not include glass fibers as part thereof. Thru hole patterns of high density are thus possible. It is believed that such a method will represent a significant advancement in the art.

OBJECTS AND SUMMARY OF THE INVENTION

It is, therefore, a primary object of the present invention to enhance the circuitized substrate art by providing a new and unique method of producing such substrates.

It is another object of the invention to provide such a process in which several conductive thru holes are formed, including, if desired, to interconnect various conductive layers of the substrate, and that such thru holes are formed without mechanical drilling.

It is still another object of the invention to provide such a process which can be implemented using, for the most part at least, conventional printed circuit board technologies (including methods and apparatus) without extensive modification thereof.

According to one aspect of the invention, there is defined a method of making a multilayered circuitized substrate comprising forming first and second conductive layers using a continuous process including forming first and second pluralities of openings within these first and second conductive layers, respectively, forming first and second sub-composite substrates including the first and second conductive layers, respectively, with at least one dielectric layer bonded to each of the first and second conductive layers, respectively. Importantly, the sub-composite dielectric layers do not include continuous or semi-continuous fibers as part thereof. The method further involves aligning the first and second sub-composites relative to one another such that the first and second pluralities of openings within these first and second conductive layers align relative to one another, bonding the first and second sub-composites together to form a multilayered substrate, laser drilling a plurality of holes through the entire thickness of the multilayered substrate, including through the aligned first and second pluralities of openings within the first and second conductive layers, providing electrically conductive material within the plurality of holes so as to form electrically conductive thru holes through the entire thickness of the multilayered substrate. The multilayered substrate includes the first and second conductive layers and the formed electrically conductive thru holes, thereby forming a circuitized substrate.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "sub-composite" as used herein to define a substrate construction is meant a substrate including at least one dielectric layer and at least one conductive layer bonded thereto, this "sub-composite" adapted for being bonded to other similar sub-composites to form a larger, multilayered circuitized substrate.

By the term "continuous" as used herein when defining the process to manufacture the conductive layers which will each form an important part of the sub-composites herein is meant that this conductive layer will be in the form of a continuous layer, up to the point of final segmenting thereof to define the layer's final construction (cross-section and outer dimensions). This segmented layer part will then be bonded to at least one (and preferably two) other dielectric layer(s) to form such a sub-composite. That is, all steps to produce this conductive layer are performed while the conductive layer remains as provided from its original source (e.g., a roll), until segmenting occurs.

By the term "continuous" as used herein to define glass fibers for previously known dielectric layers is meant fibers which extend continuously across the entire width or length of the dielectric layer. By the term "semi-continuous" as used in this sense is meant glass fibers of lesser length, sometimes also referred to as "chopped" fibers, which have lengths shorter than the overall width or length of the dielectric layer in which such fibers may exist.

By the term "circuitized substrate" as used herein is meant a multilayered substrate comprised of two or more sub-composites and a plurality of electrically conductive thru holes which extend through the multilayered substrate's thickness, thereby providing multiple circuit paths with the substrate.

Figure 1:
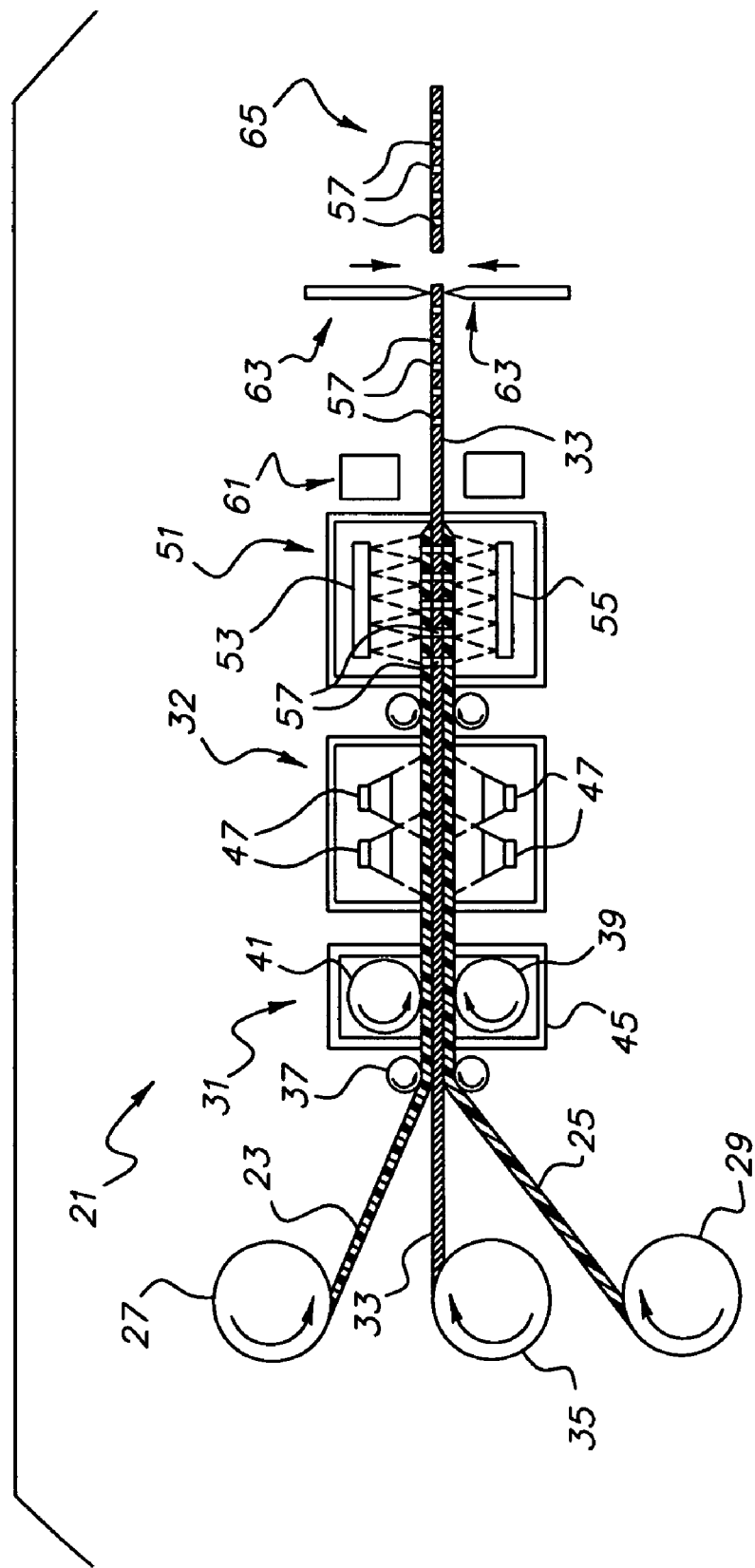
FIG. 1 is a plan view illustrating an apparatus for producing a plurality of individual conductive layers on a continuous basis, according to one embodiment of the invention.

In FIG. 1, there are shown the various steps of forming a plurality of electrically conductive layers for use in the sub-composites (defined below) produced herein, according to one embodiment of the invention. These steps are performed using an apparatus 21, which, as described, is able to make these layers in a continuous manner, meaning that each conductive layer is formed from a continuous layer of conductive material which remains in this continuous format until final separation of each individual layer member occurs at the end of the process. In FIG. 1, first and second photo-resist layers 23 and 25 are provided from individual roll members 27 and 29, respectively, to a first bonding station 31. As part of this feeding operation, a conductive layer 33 is also fed, also from a roll member 35 such that it will be sandwiched between the upper and lower photo-resist layers 23 and 25. Preferably, these three layers are provided to a first set of feed rollers 37 which draw the layers together and feed these into the bonding station 31. In a preferred embodiment, the bonding station 31 includes at least one pair of opposed, heated rollers 39 and 41. Each of these rollers, comprised of a rubber coated steel core, is preferably heated to a predetermined temperature (in one embodiment, to a range of from about 75 degrees to about 130 degrees Celsius (C.)). Various means may be utilized to heat rollers 39 and 41, the preferred being electrical resistive heaters contained within the steel core of each roller. Each of the rollers 39 and 41 are shown as being positioned within a housing 45, but this is not a necessary requirement. The rollers exert a force within the range of from about 10 pounds per square inch (p.s.i.) to about 80 p.s.i. on the layers as these pass there-between. As a result, each of the outer photo-resist layers 23 and 25 is firmly bonded to the interim, common conductive layer 33.

In a preferred embodiment, each of the layers 23 and 25 is comprised of a conventional dry film photo-resist, a preferred example being Riston EtchMaster photo-resist, available from E. I. du Pont de Nemours and Company, having an office in Research Triangle Park, N.C., USA. Each layer preferably possesses a thickness within the range of from about 0.6 mils to about 2.0 mils. The corresponding interim conductive layer is preferably copper and has a thickness of from about 0.5 mils to about 3 mils. As understood from the foregoing, this conductive layer 33 will remain as a substantially solid (including openings as provided), integral member throughout the entire continuous method defined herein, up to the final severance of selected lengths thereof to define the final length of each of the conductive layers for use in the substrates herein.

After compression (lamination) of the three layers has occurred, a bonded structure now results and is now passed on to the next station 32. At station 32, the bonded structure (with the photo-resist forming the outer layers) is subjected to an exposure step in which the photo-resist material is exposed to define a specific opening pattern therein. These openings are to eventually form the desired pattern of openings in each such conductive layer. In one example, these openings may serve as clearance openings, but may also function in another capacity (e.g., as a power plane to one or more other conductive layers which form part of the sub-composite). It is necessary to define the opening patterns in the outer photo-resist layers to define the copper layer's pattern, as the photo-resist is primarily used for this purpose and will be eventually discarded (stripped away) in subsequent steps of this continuous process. The exposure operation conducted at station 32 is performed using known exposure lamps, shown by the numerals 47, it being understood that various masking structure (not shown) is also required and well within the knowledge of one skilled in the art.

After exposure has occurred, the bonded three-layered structure is moved to station 51 in which development of the photo-resist, etching of the openings within the composite and subsequent removal of the photo-resist is performed. Development is accomplished using a conventional developer known in photolithographic processing, the developer deposited on the external surfaces of the structure and thus serving to remove the corresponding portions of the photo-resist material and expose the desired opening locations thereunder. During the etch procedure, a conventional etchant (preferably cupric chloride) is sprayed onto the composite using spray devices 53 and 55. The structure so formed will thus include these openings 57. The corresponding photo-resist layers 23 and 25, having the developed (removed) holes therein which align relative to openings 57, is also shown. Although etching is defined as the means of providing openings 57, the invention is not limited thereto in that other procedures, including mechanical or laser drilling and punching are possible, these methods not requiring the use of photo-resist layers 23 and 25.

The conductive layer 33, still a single elongated member as shown, is further advanced to an optical test device 61 in which highly precise television cameras inspect the formed apertures, now found only within the common conductive layer 33 remaining following withdrawal from station 51. As stated, the aforementioned develop and etch processes have served to effectively remove the outer photo-resist layers 23 and 25 from the interim copper conductive layer 33 such that only this copper layer is now advanced. Following optical inspection, the conductive layer 33 is continuously advanced to the next station 63 during which the individual conductive layers 65 (one shown in FIG. 1) are separated (preferably using a sheering device in which opposing blades 135 are used). In one example, each of the individual conductive layer members 65 may possess a width of about eighteen inches and a length of about twenty-four inches. Each includes a desired pattern of openings therein. In one example of the invention, each layer member 65 may include from about 500 to about 500,000 openings, including in a pattern density as much as from about one opening per square inch to about 28,000 openings per square inch. Such a high number of openings is indicative of the densification possible using the teachings herein.

It is understood that according to the unique teachings of the present invention, it is possible to not only provide several similar conductive layer members 65 each having the same opening pattern, but also to provide such conductive members with different opening patterns. This difference in opening patterns may be accomplished by appropriate software to coordinate the respective exposure operation at station 32 to thereby expose different parts of the photo-resist and thus expose a similar different pattern of metal of the interim copper layer 33. Etching will then occur as it did above, but this time to form this different opening pattern.

Figure 2:
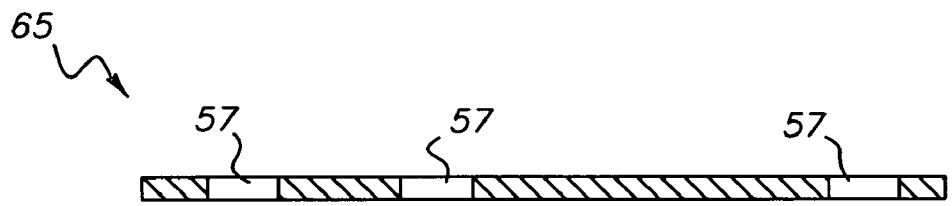
FIGS. 2-11 illustrate the steps of forming a multilayered circuitized substrate using at least two (and possibly more) of the conductive layer members formed using the apparatus of FIG. 1, these steps including forming a sub-composite substrate each including one of the conductive layer members, which sub-composite will be bonded to other, similar sub-composites to thus form said multilayered substrate.

One example of a conductive layer 65 is now shown in FIG. 2, on a much larger scale than that of FIG. 1. Layer 65, as stated, will form part of one of the sub-composites of the invention, and includes a plurality of openings 57 formed in a pattern as defined above. In one embodiment, layer 65 will function as a power plane in the sub-composite but this may function in other ways if desired, e.g., as a signal plane.

Figure 3:
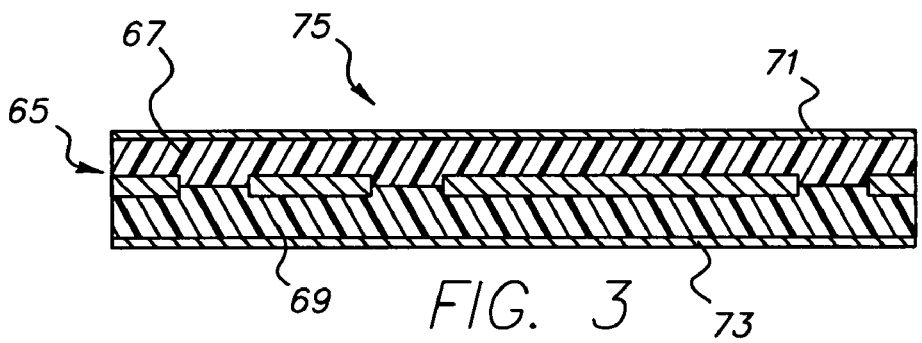

In FIG. 3, two layers 67 and 69 of dielectric material are bonded to opposite sides of layer 65, thereby filling each of the openings 57. One process for achieving such bonding is to use conventional PCB lamination and, in this particular case, the lamination may occur at a temperature of about 180 degrees C. to about 365 degrees C., with a corresponding pressure of from about 100 p.s.i. to about 2000 p.s.i. Most importantly, the dielectric material for layers 67 and 69 does not include glass fibers, whether continuous or semi-continuous. One example of a dielectric material possessing such a property is known as "Thermount" laminate material, a non-woven aramid dielectric material available from E. I. du Pont de Nemours and Company ("Thermount" is a trademark of E. I. du Pont de Nemours and Company). This material provides a lower in-plane coefficient of thermal expansion (CTE) with enhanced dimensional stability over many known dielectric materials. Another material suitable for layers 67 and 69 is referred to as resin-coated-copper (RCC), in which a chosen resin (e.g., epoxy) is coated onto a thin copper layer and this dual layered structure is then bonded to the conductive layer 65. In the embodiment of FIG. 3, the RCC is used and the thin copper layers 71 and 73 remaining as part of this structure are also shown. Understandably, the resin is coated onto the copper layers and these structures then bonded (e.g., using conventional lamination as defined above) to the opposite sides of layer 65, the resin, now cured, facing the layer 65 as shown. The result of this bonding is the formation of a sub-composite 75, which, in this embodiment, will include the interim, common conductive layer 65 and two opposing dielectric layers 67 and 69. Additionally, the outer thin copper layers 71 and 73 form part of this sub-composite. In one embodiment, copper layers 71 and 73 may possess a thickness of about 0.25 mils (a mil being one thousandths of an inch) while each layer 67 and 69 may possess a thickness of about two mils. The sub-composite 75 may then in turn possess an overall thickness of about five mils. The invention is not limited to using RCC or "Thermount" for the dielectric layer material as it is possible to use other dielectric materials, provided there are no glass fibers therein.

Figure 4:
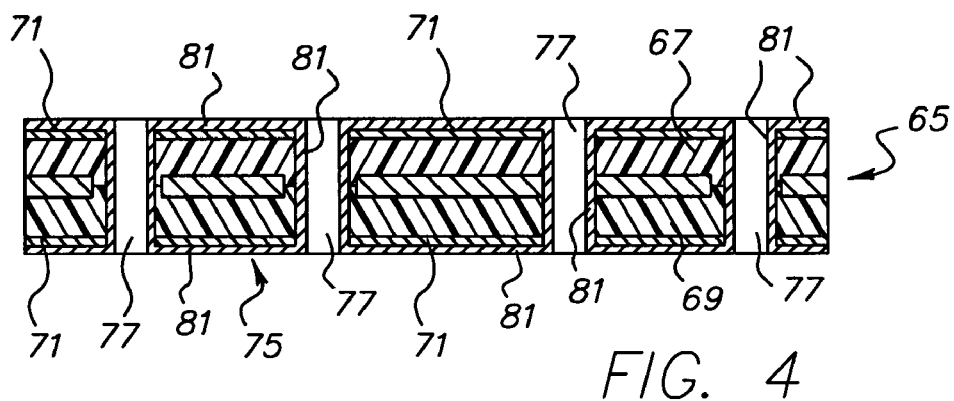

In FIG. 4, a plurality of openings 77 are formed within sub-composite 75, preferably using laser drilling, and more particularly using a CO2 or UV-YAG laser. In this embodiment, each opening 77 may possess a diameter of only about four mils, and as many as approximately 150,000 such openings may be formed within the sub-composite (only four being shown for illustration purposes). These openings may be in a pattern having a density of about 28,000 openings per square inch, thereby illustrating the highly precise detail the invention is able to accomplish with respect to various interconnections and other circuit elements. Openings 77 may extend through the corresponding openings 57 within layer 65, and, being of smaller diameter, will not be exposed to the internal conductive surfaces of layer 65. One opening 77 (second from the right in FIG. 4) may have its internal walls flush with the internal walls of layer 65, as shown. Other possible combinations are possible and further definition is not deemed necessary at this time. After openings 77 are drilled, each is preferably cleaned (using a conventional cleaning solution) and then provided with conductive material so as to render these electrically conductive. In the case of the opening 77 exposing the internal conductive surfaces of layer 65, this conductive material will be formed thereon as well. In one embodiment, the internal walls of each opening are "seeded" with a conventional metal, e.g., palladium, using a conventional operation known in PCB manufacturing. After seeding, the openings are plated with a layer 81 of metal, e.g., copper, to a thickness of 0.5 mils. The preferred plating operation to accomplish this is electrolytic copper plating. Each opening 77 will then have an internal diameter of about three mils.

Figure 5:
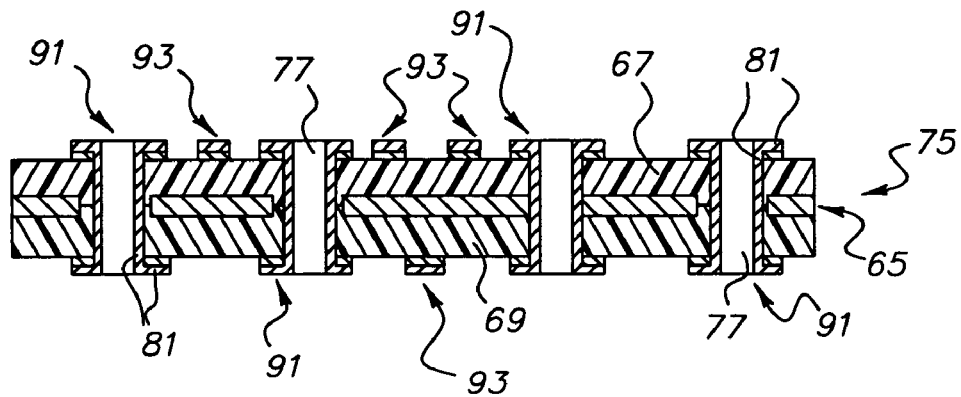

In FIG. 5, sub-composite 75 is subjected to a conventional photolithographic processing operation in which photo-resist is applied to the opposite surfaces thereof, exposed and developed, removed, and an etching operation (e.g., using conventional cupric chloride etchant) then following. The result is the definition of "land" elements 91 at opposite ends of each now conductive opening (thru hole) 77 and various signal lines 93, all located on the external surfaces of sub-composite 75. The pattern of lines 93 may be of any pattern required by the product designer and that shown is for illustration purposes only. It is also understood that the pattern of openings 77 may be of any orientation (e.g., pairs of same being more closely oriented, while other pairs are more spaced apart) and the depicted pattern is also for illustration purposes. Briefly, the formation steps to make a sub-composite according to one embodiment of the invention and as shown in FIG. 5 are now complete.

Figure 6:
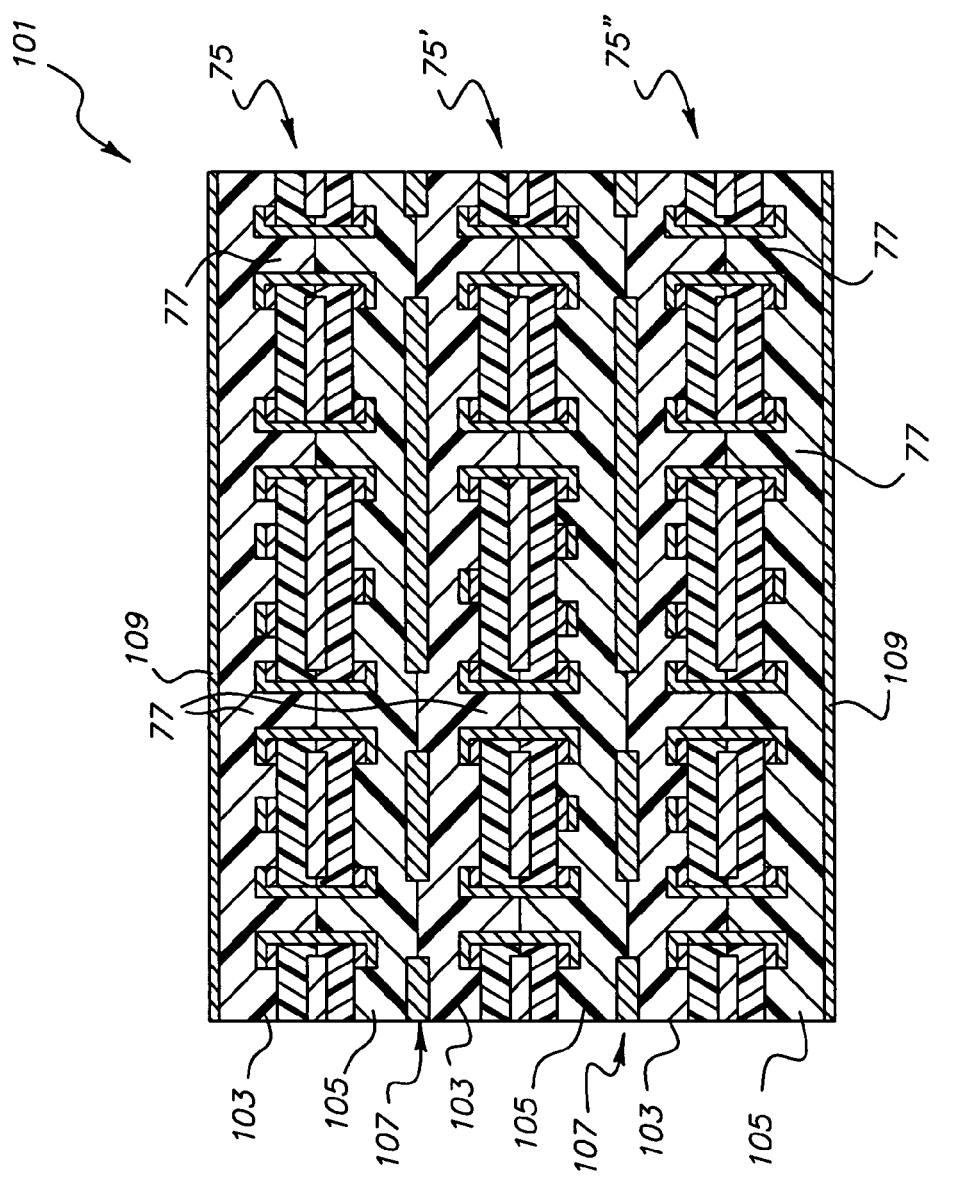

In FIG. 6, three such sub-composites 75, 75' and 75" are shown as being aligned and bonded together, thereby forming a multilayered substrate 101. In the broadest aspects of the invention, substrate 101 may include only two such sub-composites. It is also possible to use more than three if desired, again depending on the operation requirements for the final multilayered product. Significantly, each sub-composite, regardless of signal line patterns, is aligned relative to the others such that the openings 77 of each are aligned in a vertical orientation relative to corresponding openings in the other two. Bonding of the sub-composites is accomplished using a conventional PCB lamination process, this time involving a temperature within the range of about 170 degrees C. to about 210 degrees C. (e.g., 190 degrees C.) and pressure of from about 400 p.s.i. to about 600 p.s.i. (e.g., 500 p.s.i.). Other pressures and temperatures are possible, depending on the number of sub-composites, the various materials used, etc. As part of this process, glass-free dielectric layers 103 and 105 are aligned on opposite sides of each sub-composite, and, between these dielectric layers on opposite sides of the interim sub-composite 75', individual conductive layers 107 are also aligned. The entire subassembly of sub-composites, added dielectric layers and two added conductive layers is then laminated in a conventional lamination press at the temperatures and pressures defined above. The preferred dielectric material for layers 103 and 105 is the above described "Thermount" or the defined RCC material. If the RCC material is used for the outer layers, each will include a thin copper layer 109 thereon, layers 109 being substantially the same thickness as layers 71 in FIG. 3, and thus able to provide at least two additional conductive (e.g., signal) layers for substrate 101. Substrate 101 in FIG. 6 is thus shown to include at least thirteen individual conductive layers, with those in each of the sub-composites being interconnected as illustrated.

Figure 7:
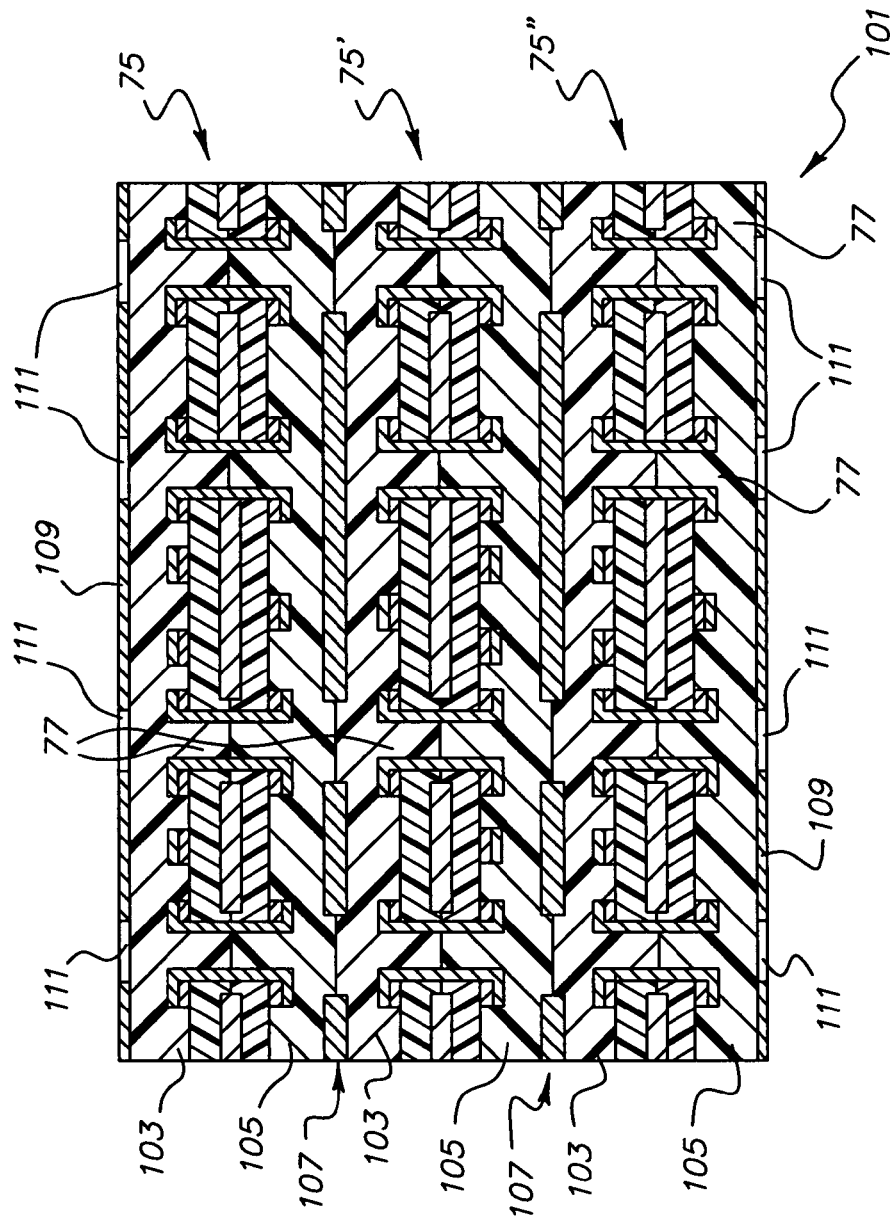

In FIG. 7, the outer copper layers 109 are etched (using a mask) to provide holes 111 therein, each of these holes 111 aligning with the already aligned openings within the bonded sub-composites. Depending on which laser will be used in the next step (defined below), such holes 111 may or may not be formed.

Figure 8:
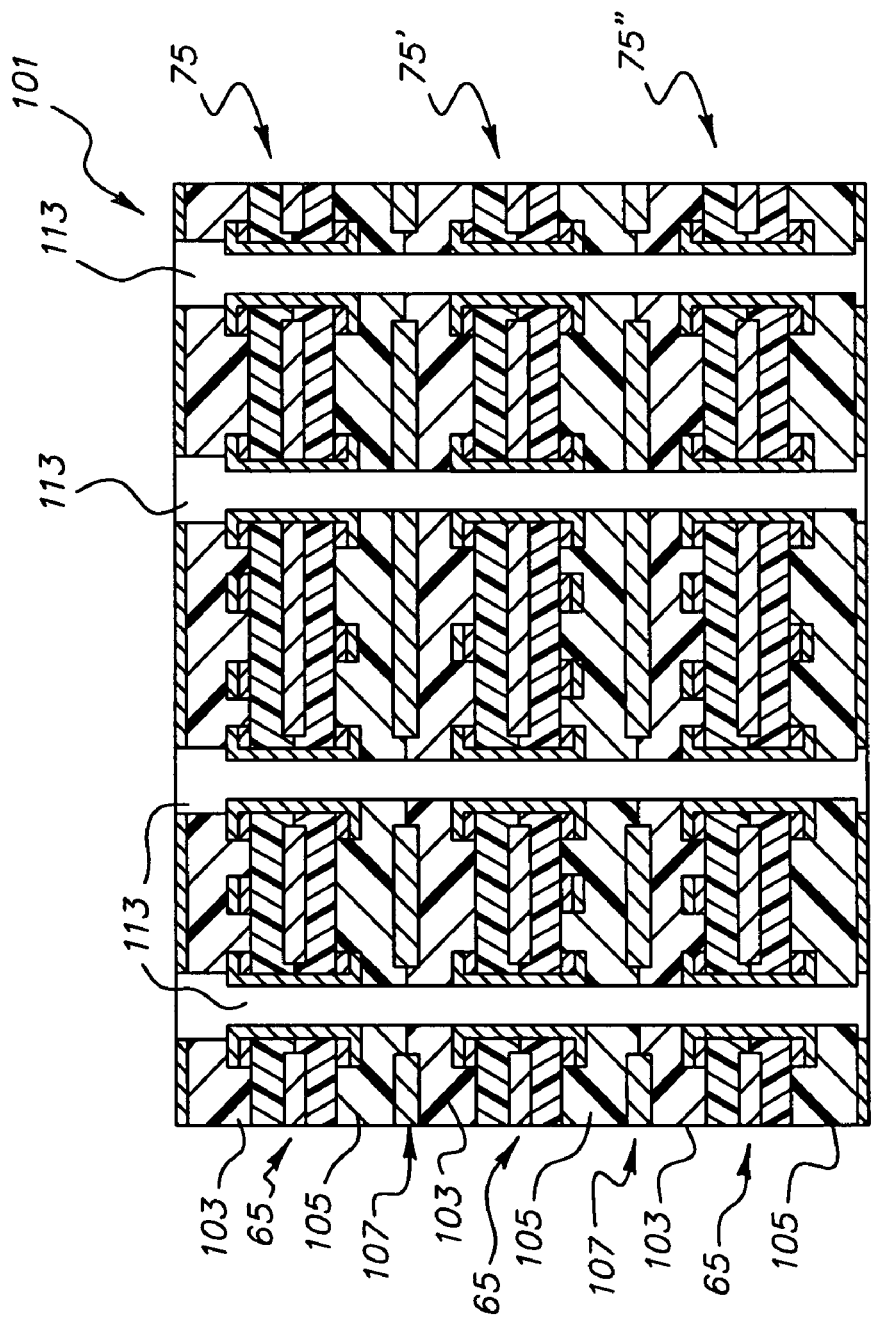

In FIG. 8, openings 113 are formed though the entire thickness of substrate 101. These openings are formed using laser drilling, preferably using a CO2 laser or a UV-YAG laser. Holes 111 are necessarily formed as shown in FIG. 7 if a CO2 laser is used, while such holes are not pre-formed if a UV-YAG laser is used (this laser capable of forming the holes as part of the drilling operation). Laser drilling through the entire thickness (substrate 101 possibly possessing a total thickness of thirty-five mils at this stage) is considered very significant with respect to the teachings herein. Drilling through such a thickness is possible without damage (e.g., due to excessive heat) of the substrate's internal layers, especially the dielectric layers. Precise drilling is also possible because of the presence of no glass fibers within any of the substrate's dielectric layers. As a result, it is possible to drill several such openings 113 (in one example, as many as 150,000, including at a pattern density the same as that of openings 77 defined above) to the relative extreme thicknesses mentioned while maintaining internal opening wall integrity, a critical feature in forming high density patterns of conductive openings. Equally significant, the assurance of sound wall integrity enables the openings to be precisely oriented within each of the corresponding openings in the sub-composites to thereby expose the conductive layers formed on said openings, as shown. Alignment is also possible to assure that openings 113 clear the internal diameters of the added internal conductive layers 107 as well, assuming such clearance is desired. The teachings herein allow the laser drilled openings 113 to also expose the conductive surfaces of layers 107, if desired, adding yet further possible circuit combinations for the finished product.

Figure 9:
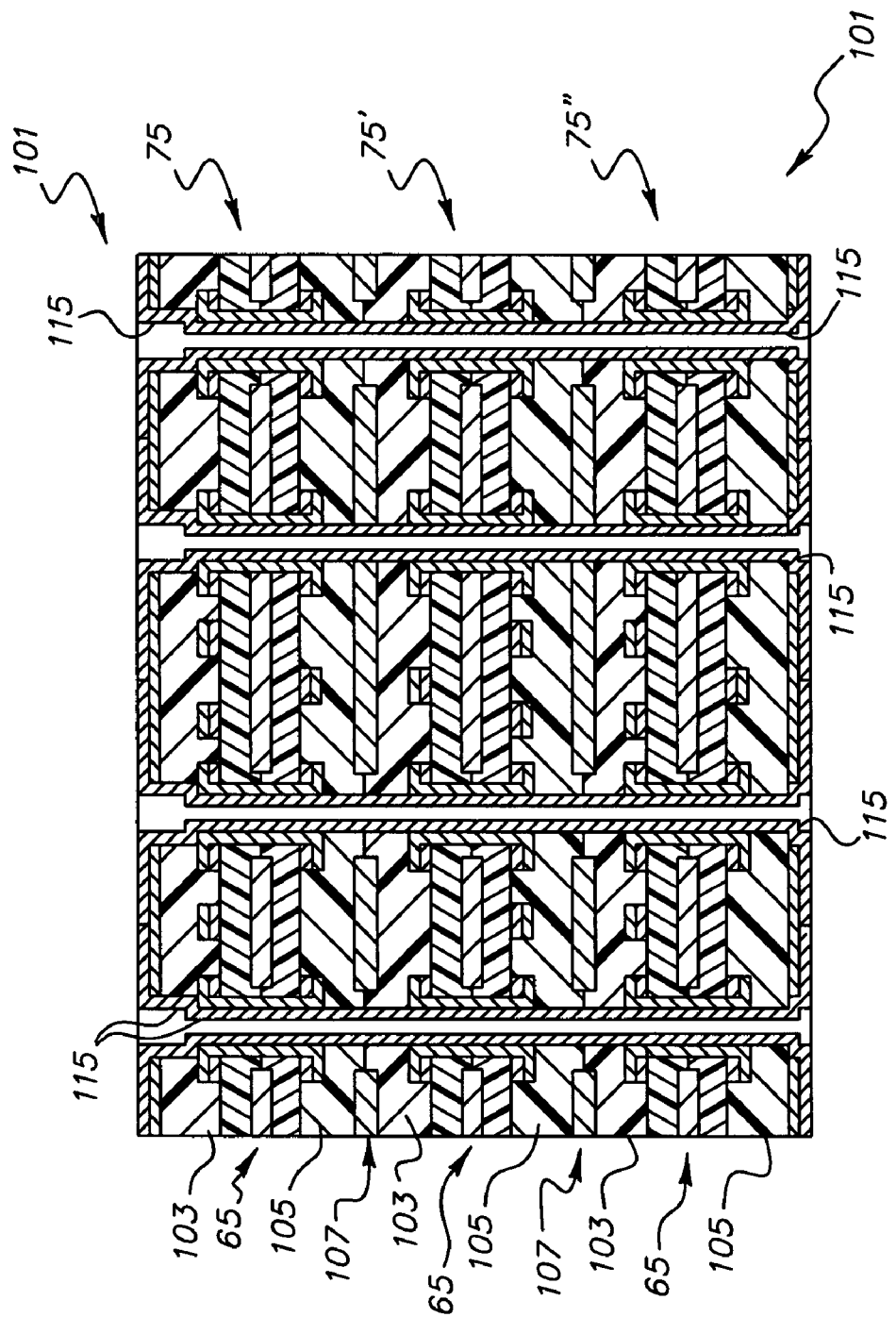
Figure 10:
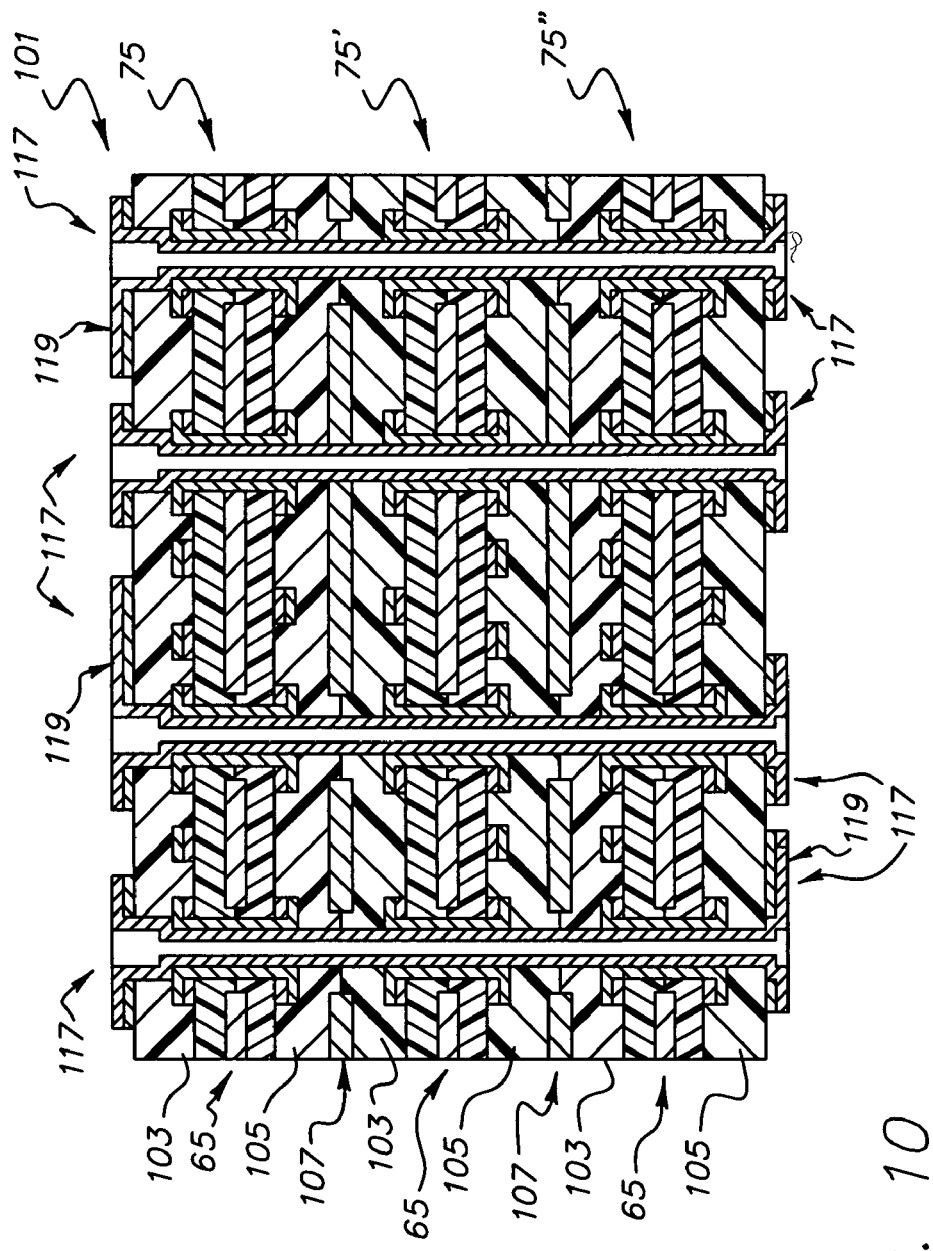

In FIG. 9, each of the openings 113 are plated to include a thin layer 115, preferably using a similar process as used for forming the conductive openings in FIG. 4 for each of the sub-composites. Cleaning of the openings prior to such plating, as occurred for the FIG. 4 openings, is also desired. As a result, each layer 115 may possess a thickness of 0.5 mils, with the corresponding opening having an internal diameter of only about two mils. The plating operation results in plating being formed on the external surfaces of substrate 101, as shown, if such plating is desired in such locations. In the instant invention, it is, so as to result in the formation of lands and possibly other circuit features, as shown in FIG. 10. This external plating thus thickens the outer conductive layering by adding an additional thickness to the already provided outer conductive layers 109. If such layers 109 were not provided in the steps defined with respect to FIG. 6, the plating 115 may alone serve as the substrate's external conductive medium.

In FIG. 10, the FIG. 9 substrate 101 is subjected to a conventional photolithographic process similar to that defined above to form individual lands 117 at opposite ends of each now conductive opening (thru hole). Lands 117 may be of different configurations, including with extending line segments 119 (three shown) if desired. That is, this conventional process may also form added conductive features, including lines (not shown) and varying width land structures, if desired. This again depends on the operational requirements for the final substrate product. These lands in the final product may be used to couple to a solder ball (not shown) or other conductor (e.g., a metal lead) which may be part of an electronic package such as a chip carrier or even a semiconductor chip, when same are positioned on the substrate 101 and thus coupled thereto.

Figure 11:
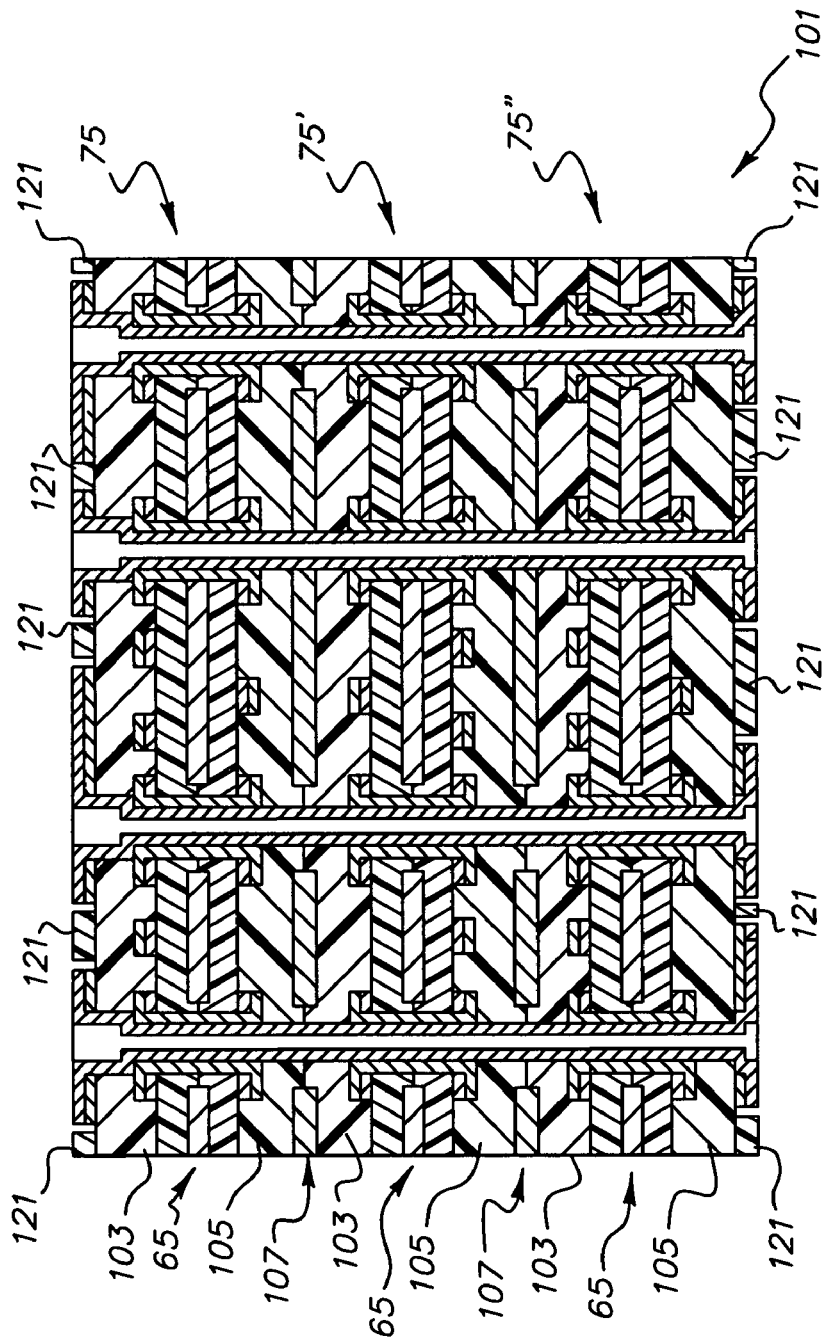

In FIG. 11, a conventional solder mask 121 is applied to the external surfaces of substrate 101, preferably using a known liquid application process, followed by conventional exposure, development and cure steps. The solder mask 121 serves to protect selected externally exposed surfaces of substrate 101 when solder is applied, e.g., providing a solder layer designed to accommodate a corresponding one of the solder balls mentioned above.

Substrate 101 is now ready for having additional elements such as the aforementioned electronic components and/or semiconductor chips mounted thereon and electrically coupled thereto. The invention is thus able to provide many combinations of electrical circuits to connect these, depending on the requirements established for the substrate. As understood, such mounting and coupling may occur on both opposite sides of the substrate. Alternatively, mounting may occur on one surface while the other is adapted for having solder balls positioned thereon to couple the substrate to yet another substrate such as a larger "mother" PCB. Several other combinations of products are possible using the unique teachings of this invention.

Thus there has been shown and described a new and unique method of making a circuitized substrate in which the conductive layers which will form part of the sub-composites which will in turn form part of the final substrate are formed using what is referred to as a continuous process. The sub-composites are bonded together in a precisely aligned manner such that thru holes may be formed through the entire thickness of the substrate in a highly dense pattern. The substrate's dielectric materials are void of glass fibers, either continuous or semi-continuous, to thus eliminate the many problems associated therewith in high density hole pattern configurations.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a multilayered circuitized substrate, said method comprising: forming first and second conductive layers using a continuous process including forming first and second pluralities of openings within said first and second conductive layers, respectively; forming first and second sub-composite substrates simultaneously including said first and second conductive layers having equal thickness, respectively, and at least one dielectric layer bonded to each of said first and second conductive layers, respectively, said dielectric layers not including continuous or semi-continuous glass fibers as part thereof; aligning said first and second sub-composites relative to one another such that said first and second pluralities of openings within said first and second conductive layers align relative to one another; bonding said first and second sub-composites together to form a multilayered substrate; laser drilling a plurality of holes through the entire thickness of said multilayered substrate, including through said aligned first and second pluralities of openings within said first and second conductive layers of said first and second sub-composites, respectively; and providing electrically conductive material within said plurality of holes so as to form electrically conductive thru holes through said entire thickness of said multilayered substrate, said multilayered substrate including said first and second conductive layers and said electrically conductive thru holes forming a circuitized substrate.

2. The method of claim 1 wherein said continuous process for forming said first and second pluralities of openings includes providing an elongated conductive layer, bonding photo-resist to opposite sides of said elongated conductive layer, exposing and developing said photo-resist on said opposite sides of said elongated conductive layer, and thereafter removing exposed parts of said elongated conductive layer to provide said first and second pluralities of said openings.

3. The method of claim 2 wherein said bonding of said photo-resist to said opposite sides of said elongated conductive layer comprises using a lamination procedure.

4. The method of claim 1 wherein said bonding of said at least one dielectric layers to each of said first and second conductive layers comprises using a lamination procedure.

5. The method of claim 1 further including forming holes within said first and second sub-composites and thereafter providing conductive material within selected ones of said holes.

6. The method of claim 5 wherein said holes are formed within said first and second sub-composites using a laser.

7. The method of claim 5 wherein said providing of said conductive material within said selected ones of said holes within said first and second sub-composites comprises using a plating operation.

8. The method of claim 1 wherein said bonding of said first and second sub-composites together to form said multilayered substrate comprises using a lamination process.

9. The method of claim 8 wherein said lamination process is conducted at a temperature within the range of from about 170 degrees C. to about 210 degrees C. and at a pressure of from about 400 p.s.i. to about 600 p.s.i.

10. The method of claim 1 wherein said laser drilling of said plurality of holes through said entire thickness of said multilayered substrate, including through said aligned first and second pluralities of openings within said first and second conductive layers of said first and second sub-composites, respectively, comprises using a $CO_2$ or UV-YAG laser.

11. The method of claim 1 wherein said providing of said electrically conductive material within said plurality of holes is accomplished using a plating process.

12. The method of claim 11 wherein said holes are seeded prior to implementation of said plating process.

13. The method of claim 1 wherein said providing of said electrically conductive material within said plurality of holes comprises positioning electrically conductive paste within said plurality of holes.

* * * * *